(12) United States Patent
Studer et al.

(10) Patent No.: US 10,585,137 B2
(45) Date of Patent: Mar. 10, 2020

(54) METHOD AND DEVICE FOR TESTING A GALVANIC CONNECTION OF A HIGH-VOLTAGE CONDENSER BUSHING ASSEMBLY

(71) Applicant: ABB Schweiz AG, Baden (CH)

(72) Inventors: Martin W. Studer, Gretzenbach (CH); Thomas Schuette, Untersiggenthal (CH)

(73) Assignee: ABB Schweiz AG, Baden (CH)

(*) Notice: Subject to any disclaimer, the term of this patent is extended or adjusted under 35 U.S.C. 154(b) by 143 days.

(21) Appl. No.: 15/786,685

(22) Filed: Oct. 18, 2017

(65) Prior Publication Data

US 2018/0106856 A1 Apr. 19, 2018

(30) Foreign Application Priority Data

Oct. 18, 2016 (EP) .................................. 16194367

(51) Int. Cl.
*G01R 31/28* (2006.01)
*G01R 31/02* (2006.01)
(Continued)

(52) U.S. Cl.
CPC ......... *G01R 31/2812* (2013.01); *G01R 15/06* (2013.01); *G01R 27/2605* (2013.01); *G01R 31/026* (2013.01); *G01R 31/04* (2013.01)

(58) Field of Classification Search
CPC ........ G01R 27/00; G01R 27/02; G01R 27/26; G01R 27/2605; G01R 31/00; G01R 31/02;
(Continued)

(56) References Cited

U.S. PATENT DOCUMENTS

| 2013/0314098 A1* | 11/2013 | Holma | ................ G01R 31/045 324/508 |
|---|---|---|---|
| 2016/0154051 A1 | 6/2016 | Watson | |
| 2017/0227582 A1* | 8/2017 | Iida | ...................... G01R 19/175 |

FOREIGN PATENT DOCUMENTS

| EP | 0185685 B1 | 8/1990 |
|---|---|---|
| WO | 2016089861 A1 | 6/2016 |
| WO | 2016146794 A1 | 9/2016 |

OTHER PUBLICATIONS

European Patent Office, Extended Search Report issued in corresponding Application No. 16194367.5, dated Apr. 18, 2017, 8 pp.

(Continued)

*Primary Examiner* — Hoai-An D. Nguyen
(74) *Attorney, Agent, or Firm* — Taft Stettinius & Hollister LLP; J. Bruce Schelkopf

(57) ABSTRACT

A method for testing the quality of a galvanic connection between a first terminal and a conductive layer of a high-voltage condenser bushing assembly is provided. The method includes providing a capacitive test circuit. The capacitive test circuit comprises the first terminal, an AC power source and a measurement unit. The method further includes providing, by the AC power source, a first test current in the capacitive test circuit. The first test current is an AC current at a first test frequency of 10 kHz or higher. The method further includes measuring, by the measurement unit, a test parameter indicative of a resistance of the galvanic connection. The method further includes determining the quality of the galvanic connection from the measured test parameter.

15 Claims, 5 Drawing Sheets

(51) Int. Cl.
*G01R 27/26* (2006.01)
*G01R 31/04* (2006.01)
*G01R 15/06* (2006.01)

(58) Field of Classification Search
CPC .... G01R 31/024; G01R 31/026; G01R 31/04; G01R 31/28; G01R 31/2801; G01R 31/281; G01R 31/2812; G01R 15/00; G01R 15/04; G01R 15/06
USPC ....... 324/500, 509, 512, 519, 522, 525, 537, 324/538, 555, 600, 649, 658, 686, 691, 324/713, 715, 718, 722
See application file for complete search history.

(56) References Cited

OTHER PUBLICATIONS

Indian Patent Office, Examination Report issued in corresponding Indian application No. 201744036077, dated Nov. 26, 2019, 5pp.

\* cited by examiner

METHOD AND DEVICE FOR TESTING A GALVANIC CONNECTION OF A HIGH-VOLTAGE CONDENSER BUSHING ASSEMBLY

FIELD

Embodiments described herein relate to a method and a device for testing the quality of a galvanic connection in a high-voltage condenser bushing assembly, more specifically a galvanic connection between a first terminal and a conductive layer of a high-voltage condenser bushing assembly.

BACKGROUND

Bushings typically include a conductor surrounded by insulation material and have applications, e.g., in high-voltage apparatuses such as generators, reactors or transformers, or in high voltage installations such as gas-insulated switchgears or as test bushings.

A bushing can be a condenser-type bushing which includes an arrangement of metallic layers in the insulation material for controlling the electric field of the bushing. Bushings can include electric connections, e.g. electric circuitry, between such conductive layers and external components of the bushing, such as a voltage measuring tap. The electric connections are often soldered. The connections of the bushing should be checked, e.g. after the design life of the bushing has been exceeded, in order to maintain reliability and availability.

Known methods for testing the quality of electric connections of a bushing are based on real-life operating conditions of the bushing. Such methods can be designed for distinguishing whether an electric connection is functioning properly. However, there is a continuous need for improving such testing methods, so that the reliability of the connection can be ensured to a maximum and the functionality of the connection can be guaranteed for a long-term period of operation.

Accordingly, there is a need for an improved method for testing the quality of the electric connections in a bushing.

SUMMARY

According to an embodiment, a method for testing the quality of a galvanic connection between a first terminal and a conductive layer of a high-voltage condenser bushing assembly is provided. The method includes providing a capacitive test circuit. The capacitive test circuit comprises the first terminal, an AC power source and a measurement unit. The method further includes providing, by the AC power source, a first test current in the capacitive test circuit. The first test current is an AC current at a first test frequency of 10 kHz or higher. The method further includes measuring, by the measurement unit, a test parameter indicative of a resistance of the galvanic connection. The method further includes determining the quality of the galvanic connection from the measured test parameter.

According to a further embodiment, a testing device is provided. The testing device is configured for testing the quality of a galvanic connection between a first terminal and a conductive layer of the high-voltage condenser bushing assembly as described herein. The testing device includes an AC power source as described herein. The testing device includes a measurement unit as described herein. The testing device includes a control unit. The testing device is configured to be electrically connected to the first terminal and to a second terminal, as described herein, of the high-voltage condenser bushing assembly. Thereby, a capacitive test circuit as described herein is provided. The AC power source is configured for providing the first test current in the capacitive test circuit. The measurement unit is configured for measuring the test parameter indicative of a resistance of the galvanic connection. The control unit is configured for determining the quality of the galvanic connection from the measured test parameter.

In view of the above, embodiments described herein operate far away from any real-life operating conditions of the high-voltage condenser bushing assembly. In particular, according to embodiments described herein, high test frequencies of 10 kHz or higher are used. Thereby, the method for testing the galvanic connection as described herein is counter-intuitive in that it departs from the standard testing methods known in the art, all of which operate at much lower test frequencies. However, as discussed in more detail below, the inventors have found that, surprisingly, the non-standard approach of moving away from real-life conditions, i.e. involving high test frequencies (possibly combined with low voltages and high currents), provides for a drastic improvement of the sensitivity and reliability of the testing method described herein.

Embodiments are directed to methods for operating the disclosed systems and devices, and to the use of the disclosed device to perform the methods according to the embodiments described herein.

Further advantages, features, aspects and details that can be combined with embodiments described herein are evident from the dependent claims, the description and the drawings.

BRIEF DESCRIPTION OF THE DRAWINGS

A full and enabling disclosure to one of ordinary skill in the art is set forth more particularly in the remainder of the specification including reference to the accompanying drawings wherein.

DETAILED DESCRIPTION

Figure 1:
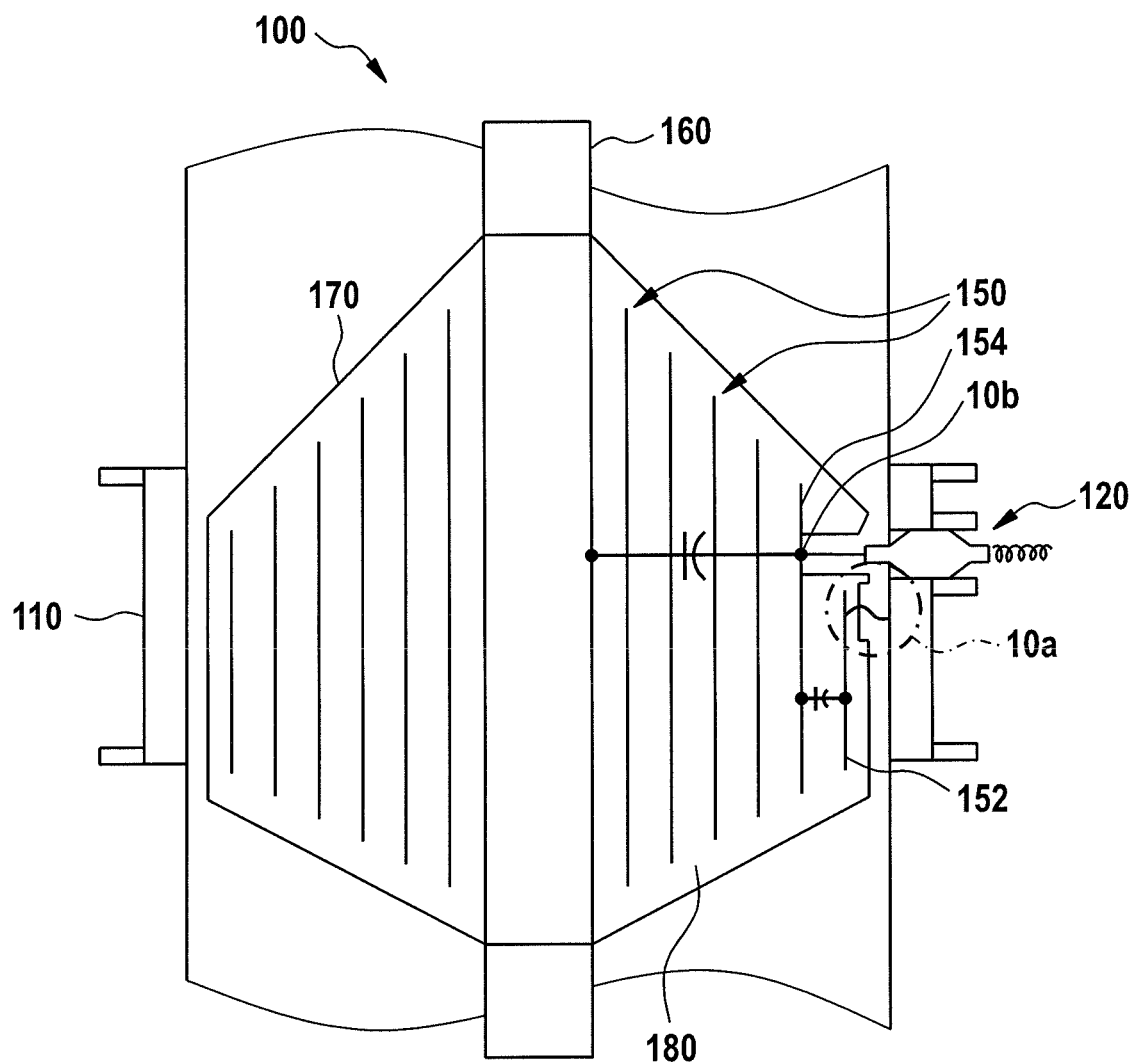
FIGS. 1 and 2 show high-voltage condenser bushing assemblies according to embodiments described herein.

Reference will now be made in detail to the various exemplary embodiments, one or more examples of which are illustrated in each figure. Each example is provided by way of explanation and is not meant as a limitation. For example, features illustrated or described as part of one embodiment can be used on or in conjunction with other embodiments to yield yet further embodiments. It is intended that the present disclosure includes such modifications and variations.

Within the following description of the drawings, the same reference numbers refer to the same components. Generally, only the differences with respect to the individual embodiments are described. The structures shown in the drawings are not necessarily depicted true to scale, and may contain details drawn in an exaggerated way to allow for a better understanding of the embodiments.

According to an embodiment, a method for testing the quality of a galvanic connection in a high-voltage condenser bushing assembly is provided.

The bushing assemblies described herein involve high-voltage technology. A high-voltage condenser bushing assembly may have a rated voltage of 24 kV or higher, particularly 69 kV or higher, or even 115 kV or higher.

A high-voltage condenser bushing assembly is a condenser-type bushing assembly including a plurality of conductive layers embedded in or on the insulation material of the high-voltage condenser bushing assembly. As described in more detail below, these layers are configured for controlling an electric field of the bushing assembly. A galvanic connection electrically connects a conductive layer of the high-voltage condenser bushing assembly with a first terminal, e.g. a voltage tap or mounting flange, of the high-voltage condenser bushing assembly. The galvanic connection provides a solid conductive bonding between the conductive layer and the first terminal. In cases where the first terminal is grounded, the galvanic connection may thus provide for a connection of the conductive layer to ground. A galvanic connection can include one or more conductive elements contacting the conductive layer and/or the first terminal. For example, the galvanic connection may include a soldered contact which may contact the first terminal, e.g. a soldered contact on the mounting flange. The quality of the galvanic connection depends on whether the galvanic connection has a good contact surface to the first terminal.

Embodiments described herein provide for a reliable method for testing the quality of a galvanic connection of high-voltage condenser bushing assembly. The method allows to detect, whether a galvanic connection lacks a contact surface sufficient for conducting a suitable amount of current between the conductive layer and the first terminal. For example, a detached or loosened soldering contact of the galvanic connection can be detected by the method described herein. Furthermore, the method is sensitive enough for detecting a galvanic connection which is in an initial stage of breaking down. For example, a galvanic connection might still have a very small contact surface, which may be sufficient to conduct a little bit of electric current for the time being, but which may soon deteriorate and result in a failure of the galvanic connection. Embodiments described herein allow identifying such soon-to-fail galvanic connections. Accordingly, a sudden or unexpected failure of the high-voltage condenser bushing assembly and any damage thereto may be prevented.

In contrast to the high operating voltages of the high-voltage condenser bushing assembly, the method and device for testing the galvanic connections are configured for operating at low test voltages, e.g. at a test voltage of 50 $V_{AC}$ or even smaller. With such low test voltages, the presence of arcing is avoided, thereby further increasing the reliability and sensitivity of the method. Further, the low test voltages allow the method to be carried out under safe operating conditions.

In light of the above, embodiments described herein allow reliably testing a galvanic connection of high-voltage condenser bushing assembly by means of a safe, fast, effective and inexpensive method.

The method can be applied to all types of high-voltage condenser bushing assemblies. Two exemplary embodiments of a high-voltage condenser bushing assembly 100 are shown in FIGS. 1 and 2 and are discussed in more detail the following.

Figure 2:
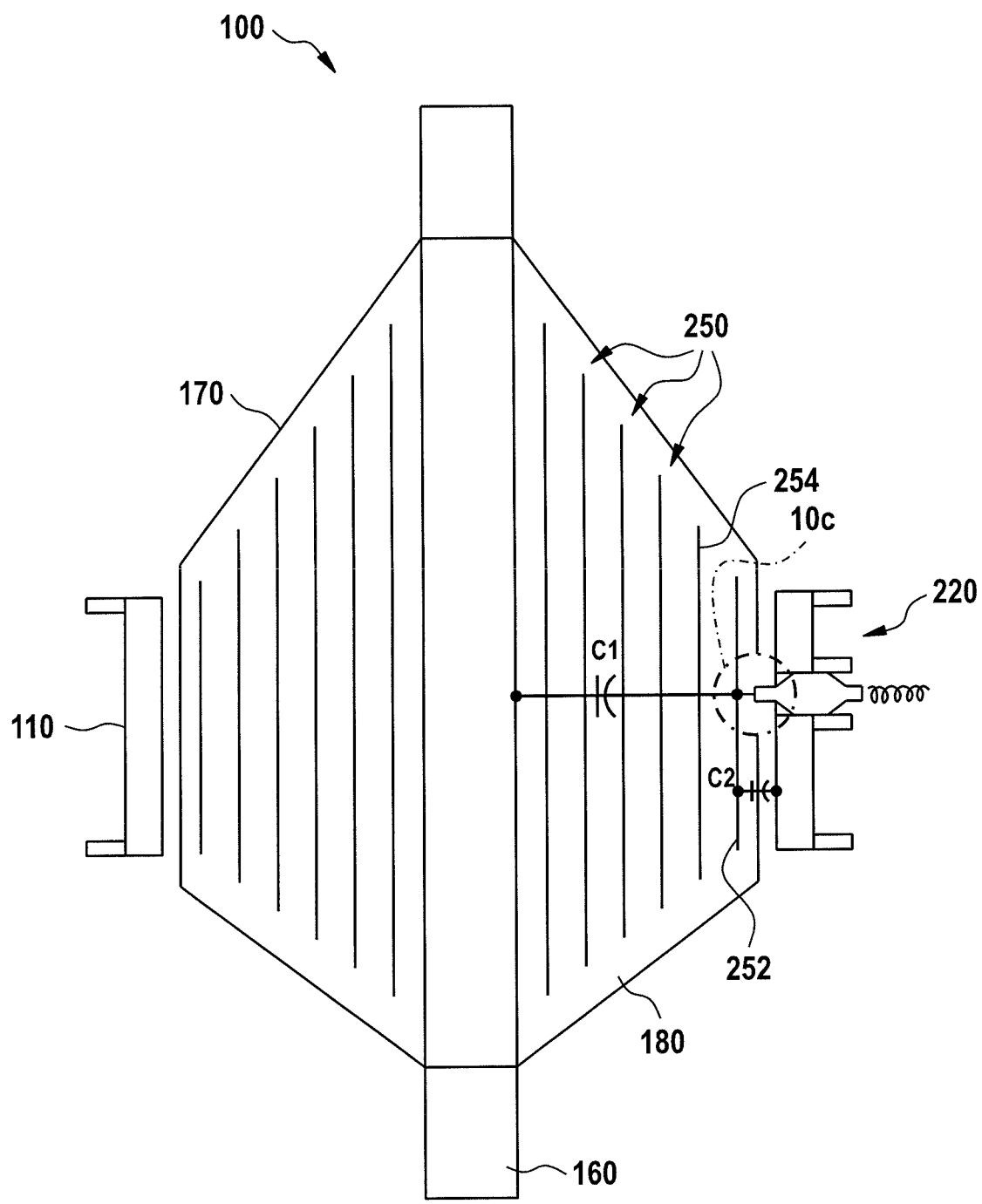

FIG. 1 shows a high-voltage condenser bushing assembly 100 according to an embodiment. The high-voltage condenser bushing assembly 100 may be configured for use with a transformer (not shown). As shown, the high-voltage condenser bushing assembly 100 may include a main conductor 160. As shown in FIG. 1, the main conductor 160 may extend along an axial direction of the high-voltage condenser bushing assembly 100. The main conductor may extend through a center of the high-voltage condenser bushing assembly 100. The main conductor 160 may have a width of 20 mm or higher. The main conductor may be configured, e.g., for carrying a current of up to 40 kA at a voltage up to 550 kV or even higher.

As shown in FIG. 1, the high-voltage condenser bushing assembly 100 may include a body 170. The body 170 may include insulation material 180. The insulation material 180 may include at least one of paper, resin such as epoxy, oil, and the like. The insulation material 180 may include combinations such as oil and paper, resin and paper or epoxy and paper. A high-voltage condenser bushing assembly may include, e.g., an OIP (oil-impregnated), RBP (resin-bonded paper), RIP (resin-impregnated paper) or RIS (resin-impregnated synthetics) bushing assembly.

As further shown in FIG. 1, the high-voltage condenser bushing assembly 100 may include a plurality of conductive layers 150, e.g. aluminum foil layers. The plurality of conductive layers 150 may be provided in the body 170. The plurality of conductive layers 150 may be surrounded by the insulation material 180. For example, a portion of the insulation material 180 may be provided between neighboring conductive layers. The plurality of conductive layers 150 may include a plurality of concentric cylinders surrounding the main conductor 160. The plurality of conductive layers 150 are configured for controlling an electric field distribution of the high-voltage condenser bushing assembly 100, particularly for gradually decreasing the voltage from the main conductor 160 to the outermost conductive layer 152. The plurality of conductive layers 150 may control the electric field distribution in a radial and/or axial direction of the high-voltage condenser bushing assembly 100. The plurality of conductive layers 150 may include 5 or more conductive layers, e.g. 10 conductive layers.

The plurality of conductive layers 150 shown in FIG. 1 includes conductive layers 152 and 154. Conductive layer 152 is an outermost layer or C2 layer. Conductive layer 154 is a second-outermost layer or C1 layer. The conductive layer 152 and/or the conductive layer 154 may be grounded. The conductive layer 152 may be grounded to a mounting flange 110.

As further shown FIG. 1, the high-voltage condenser bushing assembly 100 may include a mounting flange 110. The body 170 of the high-voltage condenser bushing assembly 100 may be mounted to the mounting flange 110. The mounting flange 110 may be cylindrically shaped. The mounting flange 110 may surround the body 170.

The high-voltage condenser bushing assembly 100 may include a voltage tap or a test tap. For example, the voltage tap 120 shown in FIG. 1 schematically represents an IEEE voltage tap. A voltage tap may be grounded, be floating or be connected to a potential device.

The high-voltage condenser bushing assembly 100 includes one or more galvanic connections. According to embodiments described herein, a galvanic connection connects a conductive layer of the high-voltage condenser bushing assembly 100 to a terminal of the high-voltage condenser bushing assembly 100. The terminal may, for example, be a mounting flange or voltage tap, as discussed in more detail below.

In FIG. 1, two galvanic connections 10a and 10b are schematically shown. Galvanic connection 10a connects conductive layer 152, i.e. the outermost conductive layer, to the mounting flange 110. Galvanic connection 10b connects conductive layer 154, i.e. the second-outermost conductive layer, to the voltage tap 120.

FIG. 2 shows a high-voltage condenser bushing assembly 100 according to another embodiment. The high-voltage condenser bushing assembly 100 shown in FIG. 2 includes a plurality of conductive layers 250. The plurality of conductive layers 250 includes a conductive layer 252, which is an outermost layer. The plurality of conductive layers 250 includes a conductive layer 254, which is a second-outermost layer. The high-voltage condenser bushing assembly 100 shown in FIG. 2 includes a galvanic connection 10c. Galvanic connection 10c connects conductive layer 252, i.e. the outermost conductive layer, to a voltage tap 220. The voltage tap 220 may be an IEC voltage tap.

Figure 3:
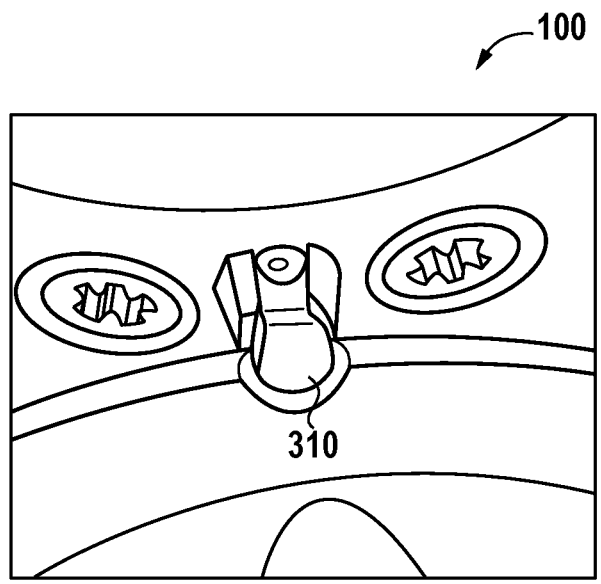
FIG. 3 shows an example of a soldered contact of a galvanic connection of a high-voltage condenser bushing assemblies according to embodiments described herein.

The galvanic connection, e.g. galvanic connection 10a, 10b or 10c, may include a soldered contact contacting the terminal. FIG. 3 shows an example of such a soldered contact 310.

Figure 4:
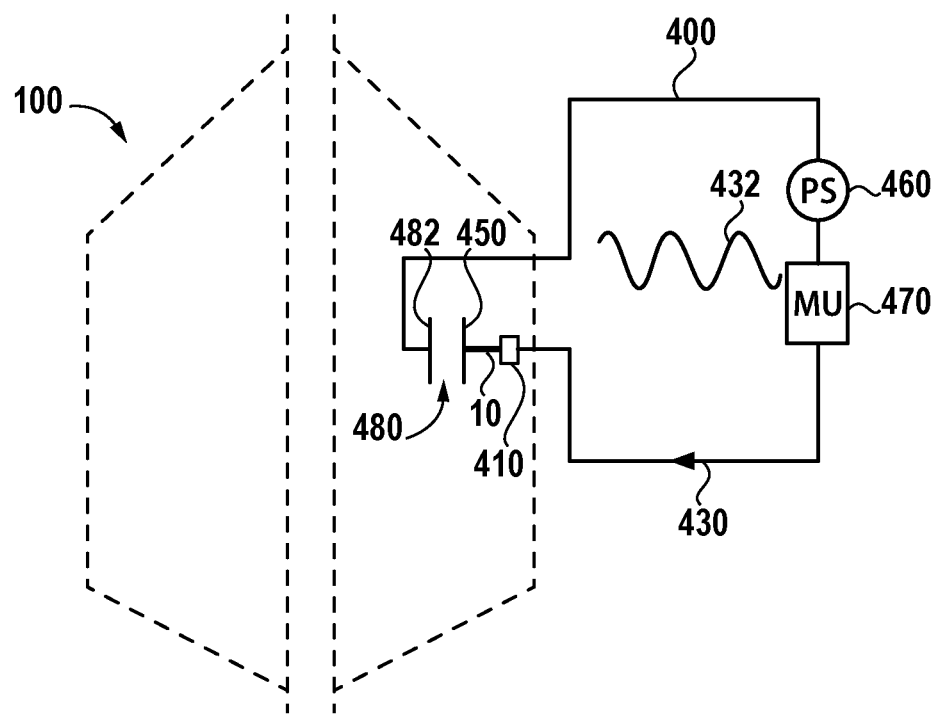
FIGS. 4-6 illustrate a method for testing the quality of a galvanic connection between a first terminal and a conductive layer of a high-voltage condenser bushing assembly according to embodiments described herein.

FIG. 4 schematically illustrates a method for testing the quality of a galvanic connection 10 between a first terminal 410 and a conductive layer 450 of a high-voltage condenser bushing assembly 100. The method includes providing a capacitive test circuit 400. The capacitive test circuit 400 includes the first terminal 410, an AC power source 460 and a measurement unit 470. The method includes providing, by the AC power source, a first test current 430 in the capacitive test circuit 400. The first test current is an AC current at a first test frequency 432 of 10 kHz or higher, or—in complete generality of the invention—preferably 20 kHz or higher, more preferably 50 kHz or higher, more preferably 100 kHz or higher, more preferably 200 kHz or higher, more preferably 500 kHz or higher, most preferably 1000 kHz or higher. The method further includes measuring, by the measurement unit 470, a test parameter indicative of a resistance of the galvanic connection 10. The method further includes determining the quality of the galvanic connection 10 from the measured test parameter.

Testing the quality of a galvanic connection 10 may include testing the integrity of electric circuitry of the galvanic connection 10 connecting the conductive layer 450 to the first terminal 410. Alternatively or additionally, testing the quality of the galvanic connection 10 may include testing the integrity of an electric contact or contact surface of the galvanic connection 10. Still alternatively or additionally, testing the quality of the galvanic connection 10 may include determining whether the galvanic connection 10 is defective or non-defective. A defective galvanic connection 10 has a higher resistance as compared to a non-defective galvanic connection.

The conductive layer 450 may be arranged in a body of the high-voltage condenser bushing assembly 100, e.g. body 170 shown in FIGS. 1 and 2. The conductive layer 450 may be cylindrically shaped. The conductive layer 450 may surround a main conductor of the high-voltage condenser bushing assembly. The conductive layer 450 may be a metallic layer, e.g. made of aluminum. The conductive layer 450 may, e.g., be an outermost conductive layer or a second-outermost conductive layer of the plurality of conductive layers, e.g. layer 152, 154, 252 or 254 shown in FIGS. 1-2.

A terminal of the high-voltage condenser bushing assembly 100, such as the first terminal 410 shown in FIG. 4 or a second terminal as described below, may include a conductive portion of the high-voltage condenser bushing assembly, which is electrically connected to the conductive layer 450 via the galvanic connection 10. A terminal may include an outer portion of the high-voltage condenser bushing assembly. Accordingly, a terminal can easily be accessed from the outside for being connected to a testing device. A terminal may be grounded.

In FIG. 4, a galvanic connection 10 between a conductive layer 450 and a first terminal 410 is shown. The galvanic connection 10 schematically shown in FIG. 4 may, for example, include any of the galvanic connections, e.g. 10a, 10b, 10c or other, shown in FIGS. 1 and 2.

In an example, the galvanic connection 10 shown in FIG. 4 may represent the galvanic connection 10a shown in FIG. 1. In such example, the conductive layer 450 and the first terminal 410 shown in FIG. 4 may correspond to the conductive layer 152 and (a portion of) the mounting flange 110, respectively, as shown in FIG. 1. In another example, the galvanic connection 10 of FIG. 4 may represent the galvanic connection 10b shown in FIG. 1. In this case, the conductive layer 450 and the first terminal 410 may correspond to the conductive layer 154 and (a portion of) the voltage tap 120, respectively, as shown in FIG. 1. In yet another example, the galvanic connection 10 of FIG. 4 may represent the galvanic connection 10c shown in FIG. 2. In this case, the conductive layer 450 and the first terminal 410 may correspond to the conductive layer 252 and the voltage tap 220, respectively, as shown in FIG. 2.

According to embodiments, which can be combined with other embodiments described herein, the first terminal 410 may be a mounting flange, a voltage tap or a test tap of the high-voltage condenser bushing assembly, or a portion of a mounting flange, voltage tap or test tap.

The capacitive test circuit 400 shown in FIG. 4 may include a capacitance, multiple capacitances or at least an effective capacitance as schematically illustrated in FIG. 4 at 480. A capacitance of the capacitive test circuit 400 may be defined between the conductive layer 450 and a conductive member 482 of the high-voltage condenser bushing assembly 100. The conductive member 482 may be a further conductive layer of the plurality of conductive layers. For example, a capacitance may be defined between the outermost and the second-outermost layer of the plurality of layers, e.g. a capacitance between conductive layer 152 and conductive layer 154 shown in FIG. 1. Alternatively, the conductive member 482 may, for example, be a portion of the mounting flange. For example, a capacitance may be defined between the outermost conductive layer, e.g. conductive layer 252 shown in FIG. 2, and the mounting flange 110.

According to embodiments, which can be combined with other embodiments described herein, a capacitance of the capacitive test circuit 400 may be provided in series with the measurement unit 470.

The capacitive circuit 400 is a closed circuit. As shown in FIG. 4, the AC power source 460, the measurement unit 470 and/or the first terminal 410 may be arranged in series in the capacitive test circuit 400.

As shown in FIG. 4, a first test current 430 is provided in the capacitive test circuit 400 by the AC power source 460. The first test current 430 flows through the first terminal 410. The first test current may flow through the galvanic connection 10.

The first test current is an AC current. For example, the first test current may have a sinusoidal, a substantially sinusoidal or another periodic shape.

According to embodiments, which can be combined with other embodiments described herein, the first test current 430 is a high-frequency current. The first test current 430 may be provided at a first test frequency 432 of 10 kHz or higher, particularly 100 kHz to 1000 kHz, more particularly 1000 kHz or higher. For example, the first test frequency may be in the range from 500 kHz to 5000 kHz. It is beneficial to provide a first test frequency 432 which is as high as possible. A high first test frequency 432 allows to drive up the magnitude of the first test current 430, in particular to achieve measurement precision, while maintaining a low test voltage, in particular to achieve ease and safety of measurement, for the capacitive test circuit 400.

According to embodiments, which can be combined with other embodiments described herein, the first test current 430 has a magnitude of 0.01 $A_{AC}$ or higher, particularly 0.1 $A_{AC}$ or higher, more particularly 1 $A_{AC}$ or higher (AC=alternating current). It is beneficial to provide a first test current which is as high as possible. A high first test current allows for an improved diagnosis of the quality of the galvanic connection as compared to a test method involving low test currents. In particular, the high magnitude of the first test current provides for a more sensitive detection of whether the galvanic connection has a good contact surface.

According to embodiments, which can be combined with other embodiments described herein, the first test current 430 is provided at a first test voltage of 50 $V_{AC}$ or lower, particularly 10 $V_{AC}$ or lower. An advantage of operating at such low test voltages is that thereby the presence of arcing is avoided. Accordingly, the reliability of the method is further increased. In addition, as the test voltage is low, the method is safe for the staff performing the tests, since the presence of high and dangerous voltages levels is virtually eliminated.

The first test current 430 flows through the measurement unit 470. According to embodiments, which can be combined with other embodiments described herein, the measurement unit 470 is configured to perform a measurement to assess the quality of the galvanic connection 10. In the measurement, a property of the capacitive test circuit 400, in which the first test current 430 flows, can be measured.

For example, a magnitude of current flowing in the capacitive test circuit 400, e.g. the magnitude of the first test current 430, can be measured for determining the quality of the galvanic connection. Particularly, a current flowing between the AC power source and the mounting flange may be measured by the measurement unit. The current measurement provides information about the resistance of the galvanic connection 10 and, hence, of the quality of the galvanic connection 10. Particularly, a good or non-defective galvanic connection will typically result in the measured current magnitude being large, whereas a bad or defective galvanic connection will typically result in a measured current magnitude being small. Accordingly, the measured first test current is indicative of the quality of the galvanic connection.

The measurement unit 470 is not limited to performing a current measurement. Generally, according to embodiments described herein, the measurement unit 470 is configured for measuring a test parameter indicative of a resistance of the galvanic connection 10.

The terminology that the test parameter is "indicative of" a resistance of the galvanic connection entails that the test parameter functionally depends on the resistance of the galvanic connection, in particular in an unambiguous way, so that measuring the test parameter provides or allows to gain information about the resistance of the galvanic connection. Several equivalent ways are available for measuring a resistance of an electrical component, and the terminology "indicative of" intends to encompass these equivalent approaches. For example, as described above, measuring the test parameter may include measuring the magnitude of a current flowing through the capacitive test circuit. Alternatively or additionally, measuring the test parameter may include measuring a voltage drop in the capacitive test circuit, an impedance, a capacity or effective capacity, a resonant frequency, and the like, or any combination(s) thereof. Each of these examples involves a test parameter which is indicative of a resistance of the galvanic connection.

For example, a magnitude of a current flowing through the capacitive test circuit is indicative of the resistance of the galvanic connection, since a higher resistance of the galvanic connection may result in a larger amount of current flowing through the capacitive test circuit, such that the measured magnitude of the current will be larger. Accordingly, measuring a magnitude of a current flowing through the capacitive test circuit may provide information about the quality of the galvanic connection. As another example, an effective capacity of the capacitive test circuit is indicative of the resistance of the galvanic connection, because a higher resistance of the galvanic connection may result in a lower effective capacity of the capacitive test circuit. Accordingly, measuring a capacity or effective capacity may provide information about the quality of the galvanic connection.

According to embodiments, which can be combined with other embodiments described herein, a test parameter includes at least one of the following: a current flowing in the capacitive test circuit; a voltage drop in the capacitive test circuit; a capacitance of the capacitive test circuit; an impedance of the capacitive test circuit; and a resonant frequency of the capacitive circuit. The test parameter may be measured while the first test current flows in the capacitive test circuit.

According to embodiments, which can be combined with other embodiments described herein, measuring the test parameter comprises performing a C2 measurement (i.e. measurement of capacitance value between two conductive layers and preferably measurement of capacitance value between second outermost conductive layer and outermost conductive layer).

Figure 5:
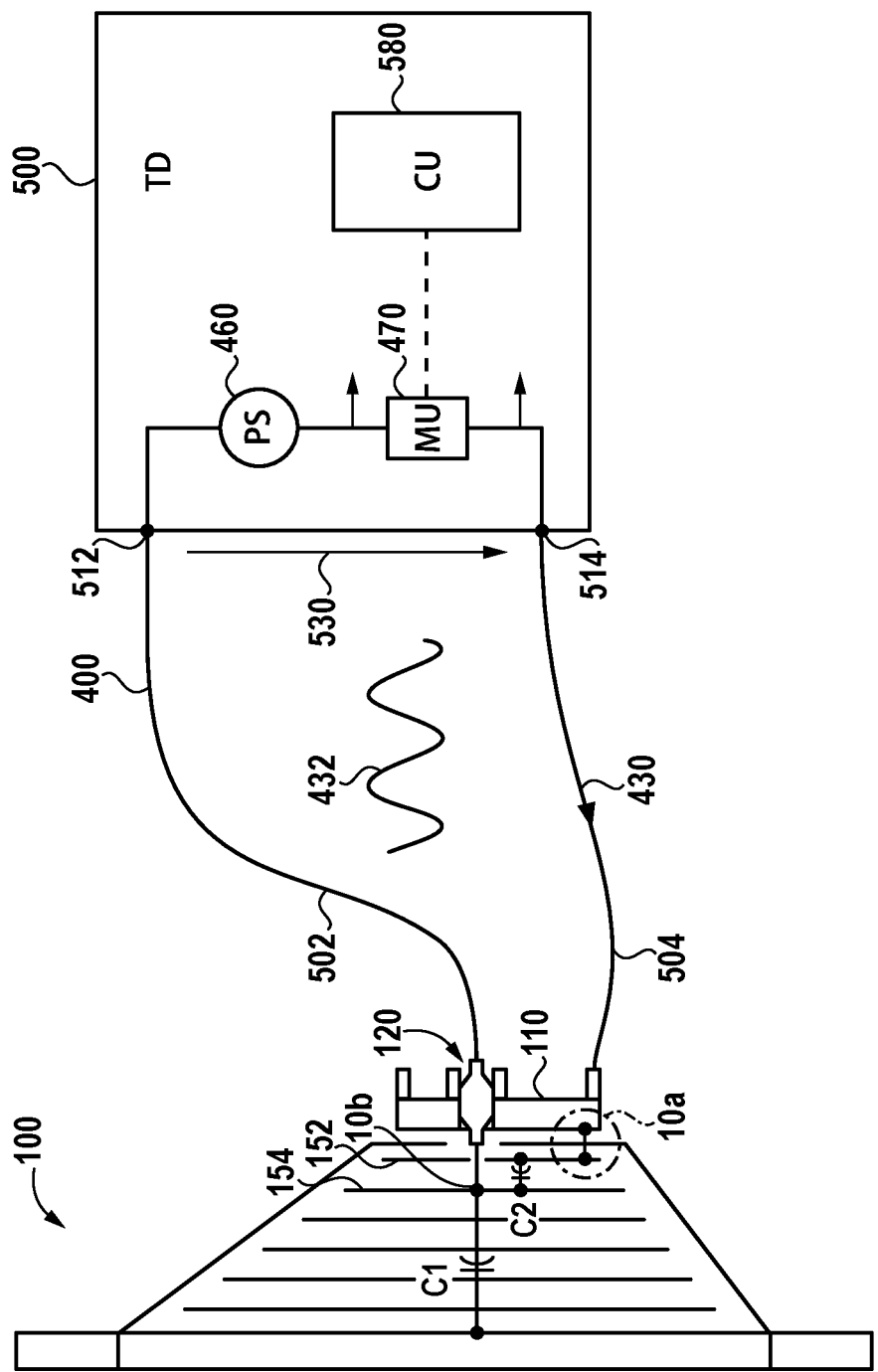

FIG. 5 illustrates a further embodiment of the method described herein. The high-voltage condenser bushing assembly 100 shown in FIG. 5 is similar to the one shown in FIG. 1.

FIG. 5 shows a testing device 500 for testing the quality of the galvanic connection 10. The testing device includes the AC power source 460, the measurement unit 470 and a control unit 580.

As shown in FIG. 5, the testing device 500 may include a first test device terminal 514. The first test device terminal 514 may be configured to be electrically connected to the mounting flange 110 of the high-voltage condenser bushing assembly 100, e.g. by means of an electric cable 504.

As further shown in FIG. 5, the testing device 500 may include a second test device terminal 512. The second test device terminal 512 may be configured to be electrically connected to the voltage tap 120, e.g. an IEEE voltage tap, of the high-voltage condenser bushing assembly, e.g. by means of an electric cable 502.

The capacitive test circuit 400 shown in FIG. 5 includes: the AC power source 460; the measurement unit 470; the electric cable 504; the mounting flange 110; the voltage tap 120; and the electrical cable 502. As shown, these components may be provided in series.

Figure 6:
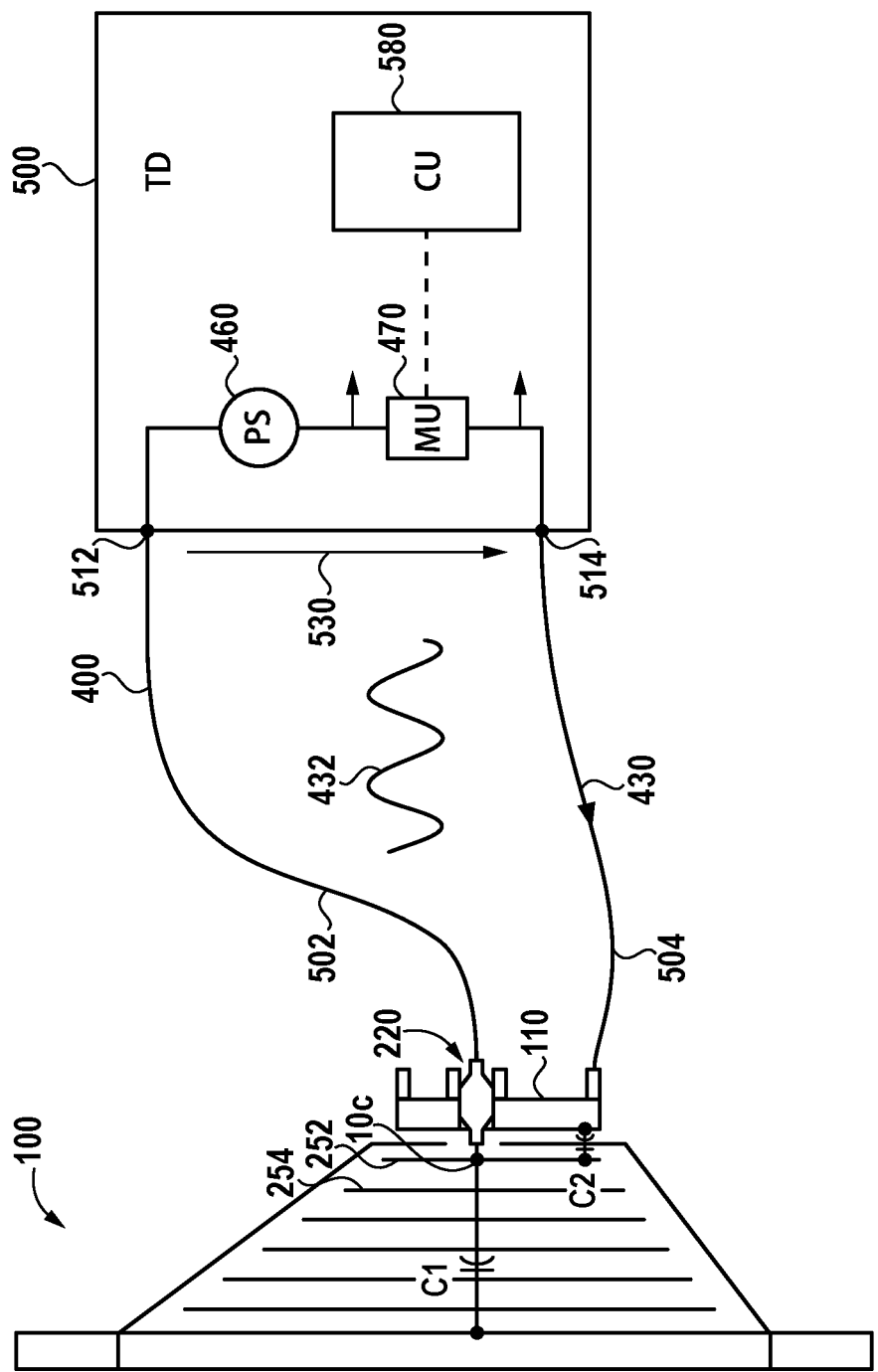

FIG. 6 illustrates a further embodiment of the method described herein. The high-voltage condenser bushing assembly 100 shown in FIG. 6 is similar to the one shown in FIG. 2. As before, first test device terminal 514 is configured to be electrically connected to the mounting flange 110 of the high-voltage condenser bushing assembly 100, e.g. by means of electric cable 504. As further shown in FIG. 6, second test device terminal 512 is configured to be electrically connected to the voltage tap 220, e.g. an IEC voltage tap, of the high-voltage condenser bushing assembly, e.g. by means of electric cable 502.

The capacitive test circuit 400 shown in FIG. 6 includes: the AC power source 460; the measurement unit 470; the electric cable 504; the mounting flange 110; the voltage tap 220; and the electrical cable 502. As shown, these components may be provided in series.

The test arrangement shown in FIG. 5 can be adapted to take advantage of the higher capacitance value between two conductive layers (C2 measurement), as compared to the smaller capacitance value between the outermost conductive layer and the mounting flange. Accordingly, the magnitude of the first test current in FIG. 5 can even be higher than that of the test current in FIG. 6.

According to embodiments, which can be combined with other embodiments described herein, the capacitive test circuit may include an electric connection, e.g. a cable or wire, connecting the AC power source to the first terminal of the high-voltage condenser bushing assembly.

According to embodiments, which can be combined with other embodiments described herein, the capacitive test circuit 400 includes a second terminal of the high-voltage condenser bushing assembly 100. The second terminal may be a voltage tap, a test tap or a mounting flange of the high-voltage condenser bushing assembly 100. For example, for a high-voltage condenser bushing assembly 100 including an IEEE voltage tap as illustrated in FIG. 5, the second terminal may be voltage tap 120. As another example, for a high-voltage condenser bushing assembly 100 including an IEC voltage tap as shown in FIG. 6, the second terminal may be the mounting flange 110. According to embodiments, which can be combined with other embodiments described herein, the capacitive circuit may include a further electric connection, e.g. a cable or wire, connecting the AC power source to the second terminal of the high-voltage condenser bushing assembly.

According to embodiments, which can be combined with other embodiments described herein, the galvanic connection comprises a soldered contact. The method may include determining the quality of the soldered contact. The soldered contact may contact the first terminal.

A galvanic connection of poor quality is characterized by a resistive behavior which, in combination with a high test current, causes a considerable voltage drop over the affected poor contact surface. The inventors have found that the higher test current, in combination with the voltage drop, can result in a thermal stress which can reliably and permanently destroy the defective contact. Such a destroyed contact can easily be detected.

On the other hand, a non-defective galvanic connection is characterized by a very low contact resistance and will carry the test current without significant voltage drop. As there is no heat being generated, a non-defective connection will not be destroyed.

According to embodiments, which can be combined with other embodiments described herein, the first test current has a magnitude configured to destroy a defective galvanic connection. For example, a magnitude configured to destroy a defective galvanic connection may be 5 $A_{AC}$ or higher, e.g. in the range from 5 $A_{AC}$ to 40 $A_{AC}$.

According to embodiments, which can be combined with other embodiments described herein, the method includes determining whether the galvanic connection was destroyed by the first test current.

The capacitive test circuit may have an effective capacity. The effective capacity may depend on whether the galvanic connection of the high-voltage condenser bushing assembly is defective or not. An effective capacity in case of a non-defective galvanic connection may be higher than an effective capacity in case of a defective capacity. Accordingly, measuring the effective capacity, or a test parameter indicative of the effective capacity, may allow testing the quality of the galvanic connection. According to embodiments, which can be combined with other embodiments described herein, the test parameter is indicative of an effective capacity of the capacitive test circuit. The method may include comparing the measured test parameter to a predetermined threshold value indicative of a threshold capacity. The method may include determining that the galvanic connection is defective, if the measured test parameter is smaller than the predetermined threshold value. The method may include determining that the galvanic connection is not defective, if the measured test parameter is greater than or equal to the predetermined threshold value. A threshold capacity may be in the range from 1 pF to 5 nF, particularly in a range from 5 pF to 5 nF.

According to embodiments, which can be combined with other embodiments described herein, the galvanic connection and the conductive layer, as described herein, may be a first galvanic connection and first conductive layer, respectively, of the high-voltage condenser bushing assembly. The high-voltage condenser bushing assembly may include a second galvanic connection, e.g. including a second soldered contact, between the second terminal and a second conductive layer of a high-voltage condenser bushing assembly. The method may include testing the quality of the second galvanic connection.

For example, with reference to FIG. 5, the first galvanic connection may be the galvanic connection 10*a* between the conductive layer 152, i.e. the outermost conductive layer, and the mounting flange 110. The second galvanic connection may be the galvanic connection 10*b* between the conductive layer 154, i.e. the second-outermost conductive layer, and the voltage tap 120.

The second conductive layer, e.g. conductive layer 154, may be different from the first conductive layer, e.g. conductive layer 152. The first conductive layer 152 and the second conductive layer 154 may be neighboring layers. No further conductive layer of the high-voltage condenser bushing assembly may be provided between the first conductive layer and the second conductive layer. The first conductive layer and the second conductive layer may define a capacity of the capacitive test circuit. The second conductive layer may be an outermost conductive layer or a second-outermost conductive layer of the plurality of conductive layers. According to embodiments, the first conductive layer is an outermost conductive layer and the second conductive layer is a second-outermost conductive layer of the high-voltage condenser bushing assembly.

According to embodiments, the test parameter may be indicative of a resistance of the second galvanic connection.

The method may include determining the quality of the second galvanic connection from the measured test parameter. Alternatively or additionally, the method may include measuring, by the measurement unit, a further test parameter indicative of a resistance of the second galvanic connection. The method may include determining the quality of the second galvanic connection from the further measured test parameter.

According to embodiments, which can be combined with other embodiments described herein, in the capacitive test circuit, the AC power source and/or the measurement unit are arranged in series between the first terminal and the second terminal.

According to embodiments, which can be combined with other embodiments described herein, the capacitive test circuit includes an inductance. A capacitive test circuit including an inductance may have a resonant frequency. The first test frequency may substantially be a resonant frequency of the capacitive test circuit. Therein, the terminology "substantially" may include a first test frequency which differs from an exact resonant frequency by a small amount, e.g. a relative difference of up to 10%. An advantage of operating the capacitive test circuit at or near a resonant frequency is that a higher test current can be provided for a given operating voltage.

According to embodiments, which can be combined with other embodiments described herein, the method includes adjusting a test frequency. An adjusted test frequency may be 10 kHz or higher, particularly 100 kHz or higher, more particularly 1000 kHz or higher. The method may include adjusting a test frequency to adjust a magnitude of the test current flowing in the capacitive test circuit. The method may include providing, by the AC power source, a second test current in the capacitive test circuit. The second test current may be an AC current at a second test frequency of 10 kHz or higher. The second test frequency is different from the first test frequency. The magnitude of the second test current is different from the magnitude of the first test current.

Embodiments described herein allow testing the quality of a galvanic connection without performing a sweep across a plurality of test voltages. The AC power source may be provided at a constant test voltage. The first test current and the second test current, as described above, may be provided at a constant test voltage. Adjusting a test frequency, as described above, may be undertaken at a constant test voltage.

According to embodiments, which can be combined with other embodiments described herein, measuring the test parameter includes measuring, by the measurement unit, a response of the capacitive test circuit to the adjustment of the test frequency. Measuring the test parameter may include determining a resonant frequency, or a frequency substantially equal to a resonant frequency, of the capacitive test circuit.

For example, measuring a response of the capacitive test circuit to the adjustment of the test frequency may involve monitoring a change of a magnitude of test current flowing in the capacitive test circuit. By measuring such response, a sweep of the test frequency can be performed to drive the magnitude of the test current towards a maximum. A test frequency corresponding to a magnitude of the test current near or at a maximum may be substantially a resonant frequency of the capacitive test circuit. Accordingly, a resonant frequency of the capacitive test circuit may be determined.

According to embodiments, which can be combined with other embodiments described herein, the test parameter may be, or may be indicative of, a resonant frequency of the capacitive test circuit. The resonant frequency depends on whether the galvanic connection is defective or not. Accordingly, measuring the resonant frequency allows determining the quality of the galvanic connection.

The first test frequency may be a frequency of the first test current. In case the first test current is not a perfect sinus, the first test frequency may be a main frequency of the first test current. Similarly, the first test frequency may be a frequency or main frequency of the first test voltage. Further, the first test frequency may be an operating frequency of the AC power source.

According to a further embodiment, a testing device is provided. The testing device is configured for testing the quality of a galvanic connection between a first terminal and a conductive layer of the high-voltage condenser bushing assembly as described herein. The testing device includes an AC power source as described herein. The testing device includes a measurement unit as described herein. The testing device includes a control unit. The testing device is configured to be electrically connected to the first terminal and to a second terminal, as described herein, of the high-voltage condenser bushing assembly. Thereby, a capacitive test circuit as described herein is provided. The AC power source is configured for providing the first test current in the capacitive test circuit. The measurement unit is configured for measuring the test parameter indicative of a resistance of the galvanic connection. The control unit is configured for determining the quality of the galvanic connection from the measured test parameter.

According to embodiments, which can be combined with other embodiments described herein, the AC power source has an operating voltage 530 of 50 $V_{AC}$ or lower, particularly 10 $V_{AC}$ or lower. The AC power source may include a current source, a voltage source, and/or a power amplifier. An impedance transformer may be provided. The AC power source may be configured to operate at an adjustable test frequency. The AC power source may be configured for operating at a test frequency of 10 kHz or higher, particularly 100 kHz or higher, more particularly 1000 kHz or higher. The AC power source may be configured for providing a test current of 0.01 $A_{AC}$ or higher, particularly 0.1 $A_{AC}$ or higher, more particularly 1 $A_{AC}$ or higher.

The testing device is adapted for performing any of the embodiments of the method described herein.

While the foregoing is directed to some embodiments of the invention, other and further embodiments may be devised without departing from the scope determined by the claims that follow.

The invention claimed is:

1. A method for testing the quality of a galvanic connection between a first terminal and a conductive layer of a high-voltage condenser bushing assembly, the method comprising:
   providing a capacitive test circuit, wherein the capacitive test circuit comprises the first terminal, an AC power source and a measurement unit;
   providing, by the AC power source, a first test current in the capacitive test circuit, wherein the first test current is an AC current at a first test frequency of 10 kHz or higher;
   measuring, by the measurement unit, a test parameter indicative of a resistance of the galvanic connection; and determining the quality of the galvanic connection from the measured test parameter.

2. The method according to claim 1, wherein the galvanic connection comprises a soldered contact, wherein the method comprises determining the quality of the soldered contact.

3. The method according to claim 1, wherein the AC power source has an opening voltage of 50 $V_{AC}$ or lower.

4. The method according to claim 1, wherein the first test current is 0.1 $A_{AC}$ or higher.

5. The method according to claim 1, wherein the first test current has a magnitude configured to destroy a defective galvanic connection, wherein the method further comprises:
   determining whether the galvanic connection was destroyed by the first test current.

6. The method according to claim 1, wherein the test parameter is indicative of an effective capacity of the capacitive test circuit, wherein the method further comprises:
   comparing the measured test parameter to a predetermined threshold value indicative of a threshold capacity;
   determining that the galvanic connection is defective, if the measured test parameter is smaller than the predetermined threshold value; and
   determining that the galvanic connection is not defective, if the measured test parameter is greater than or equal to the predetermined threshold value.

7. The method according to claim 1, wherein the first terminal is a mounting flange of the high-voltage condenser bushing assembly.

8. The method according to claim 1, wherein the capacitive test circuit comprises a second terminal of the high-voltage condenser bushing assembly, wherein the second terminal is a voltage tap of the high-voltage condenser bushing assembly.

9. The method according to claim 8, wherein, in the capacitive test circuit, the AC power source and/or the measurement unit are arranged in series between the first terminal and the second terminal.

10. The method according to claim 1, wherein measuring the first test parameter comprises performing a C2 measurement, which involves measuring a capacitance value between two conductive layers of the high-voltage condenser bushing assembly.

11. The method according to claim 1, wherein the first test parameter comprises at least one of the following:
   a current flowing the capacitive test circuit;
   a voltage drop in the capacitive test circuit;
   a capacitance of the capacitive test circuit;
   an impedance of the capacitive test circuit; and
   a resonant frequency of the capacitive circuit.

12. The method according to claim 1, wherein the capacitive test circuit further comprises an inductance, wherein the first test frequency is substantially a resonant frequency of the capacitive test circuit.

13. The method according to claim 1, wherein the capacitive test circuit further comprises an inductance, wherein the method further comprises:
   adjusting a test frequency, wherein the adjusted test frequency is 10 kHz or higher,
   wherein measuring the test parameter comprises:
   measuring, by the measurement unit, a response of the capacitive test circuit to the adjustment of the test frequency; and
   determining a resonant frequency of the capacitive test circuit.

14. The method according to claim 1, wherein the first test current is an AC current selected at a first test frequency of 20 kHz or higher.

15. A testing device performing the method of claim 1, the testing device being configured for testing the quality of a galvanic connection between a first terminal and a conductive layer of a high-voltage condenser bushing assembly, the testing device comprising:
   an AC power source configured to operate at a frequency of 10 kHz or higher;
   a measurement unit; and
   a control unit,
   wherein the testing device is configured to be electrically connected to the first terminal and to a second terminal of the high-voltage condenser bushing assembly, thereby providing a capacitive test circuit, the capacitive test circuit comprises the first terminal, the AC power source and the measurement unit,
   wherein the AC power source is configured for providing a first test current in the capacitive test circuit, the first test current is an AC current at a first test frequency of 10 kHz or higher,
   wherein the measurement unit is configured for measuring a test parameter indicative of a resistance of the galvanic connection,
   wherein the control unit is configured for determining the quality of the galvanic connection from the measured test parameter.

* * * * *